(12) United States Patent
Yeh et al.

(10) Patent No.: US 10,954,946 B2
(45) Date of Patent: Mar. 23, 2021

(54) THIN FAN

(71) Applicant: DELTA ELECTRONICS, INC., Taoyuan (TW)

(72) Inventors: Cheng-Hsien Yeh, Taoyuan (TW); Chih-Wei Chan, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 217 days.

(21) Appl. No.: 15/859,084

(22) Filed: Dec. 29, 2017

(65) Prior Publication Data
US 2018/0235103 A1 Aug. 16, 2018

Related U.S. Application Data

(60) Provisional application No. 62/458,688, filed on Feb. 14, 2017.

(30) Foreign Application Priority Data

Jun. 26, 2017 (CN) .......................... 201710494625.1

(51) Int. Cl.
*F04D 25/06* (2006.01)
*F04D 25/08* (2006.01)
(Continued)

(52) U.S. Cl.
CPC ......... *F04D 25/0646* (2013.01); *F04D 17/16* (2013.01); *F04D 25/062* (2013.01);
(Continued)

(58) Field of Classification Search
CPC .............. H05K 7/20172; F04D 25/062; F04D 25/0646; F04D 25/08; F04D 25/064;
(Continued)

(56) References Cited

U.S. PATENT DOCUMENTS 2,468,171 A * 4/1949 Carlson ................... F04D 5/002
415/55.6
5,882,122 A * 3/1999 Noguchi ................ B82Y 10/00
384/490
(Continued)

FOREIGN PATENT DOCUMENTS

CN 102465902 A 5/2012
CN 104564732 A 4/2015
(Continued)

*Primary Examiner* — Nathan C Zollinger
(74) *Attorney, Agent, or Firm* — Muncy, Geissler, Olds and Lowe, P.C.

(57) ABSTRACT

A thin fan includes a frame and a driving device. The fan frame includes a base and a frame shell. The driving device includes a stator structure and a rotor structure disposed corresponding to the stator structure. The stator structure includes a stator pole group, a bushing, a bearing and a compression-resistant pillar. The rotor structure includes a hollow-cylindrical shaft, a rotor shell, a magnetic structure and an impeller. The shaft is mounted on the outer periphery of the compression-resistant pillar and is disposed between the compression-resistant pillar and the bearing. The rotor shell is connected to the shaft. The magnetic structure is disposed on the inner wall of the rotor shell, and the impeller is connected to the rotor shell. The maximum height of the rotor structure is lower than the height of the compression-resistant pillar when the rotor structure is connected to the stator structure.

9 Claims, 6 Drawing Sheets

(51) Int. Cl.
*H05K 7/20* (2006.01)
*F04D 17/16* (2006.01)

(52) U.S. Cl.
CPC .......... *F04D 25/064* (2013.01); *F04D 25/08* (2013.01); *H05K 7/20172* (2013.01)

(58) Field of Classification Search
CPC ........ F04D 25/0613; F04D 17/16; G06F 1/20; G06F 1/203; H02K 5/1735; H02K 5/1675; F16C 17/02; F16C 17/026; F16C 17/10; F16C 17/102; F16C 17/107
USPC .................................................. 310/90, 67 R
See application file for complete search history.

(56) References Cited

U.S. PATENT DOCUMENTS

| | | | | |
|---|---|---|---|---|
| 6,307,291 B1 * | 10/2001 | Iwaki | .................... | F16C 17/045 310/261.1 |
| 6,873,069 B1 * | 3/2005 | Odagiri | ................. | H01L 23/467 165/122 |
| 7,021,829 B2 * | 4/2006 | Tamaoka | .............. | F16C 17/107 384/112 |
| 7,825,557 B2 * | 11/2010 | Drautz | ............... | G11B 19/2036 310/90 |
| 8,328,533 B2 * | 12/2012 | Yu | ......................... | F04D 25/082 310/67 R |
| 8,690,552 B2 * | 4/2014 | Chang | ..................... | F04D 17/16 415/205 |
| 8,724,256 B2 | 5/2014 | Sekii et al. | | |
| 9,166,452 B1 * | 10/2015 | Endo | ................... | G11B 19/2009 |
| 9,523,373 B2 * | 12/2016 | Tamaoka | ............... | F04D 29/422 |
| 9,551,348 B2 * | 1/2017 | Lin | .......................... | F04D 17/16 |
| 9,631,638 B2 * | 4/2017 | Lin | ......................... | F04D 25/062 |
| 2003/0124001 A1 * | 7/2003 | Chen | .................... | F04D 25/066 417/356 |
| 2010/0232733 A1 * | 9/2010 | Ito | ......................... | F16C 17/107 384/107 |
| 2011/0033300 A1 * | 2/2011 | Li | ......................... | F04D 29/063 416/174 |
| 2012/0121426 A1 | 5/2012 | Kitamura | | |
| 2015/0098844 A1 | 4/2015 | Hsu et al. | | |
| 2015/0110648 A1 * | 4/2015 | Lu | .......................... | F04D 17/16 417/354 |
| 2017/0025146 A1 * | 1/2017 | Yoneda | ............... | G11B 19/2036 |
| 2018/0100511 A1 * | 4/2018 | Tamaoka | .............. | F04D 19/002 |

FOREIGN PATENT DOCUMENTS

| | | |
|---|---|---|
| CN | 105090091 A | 11/2015 |
| TW | M442689 U | 12/2012 |

\* cited by examiner

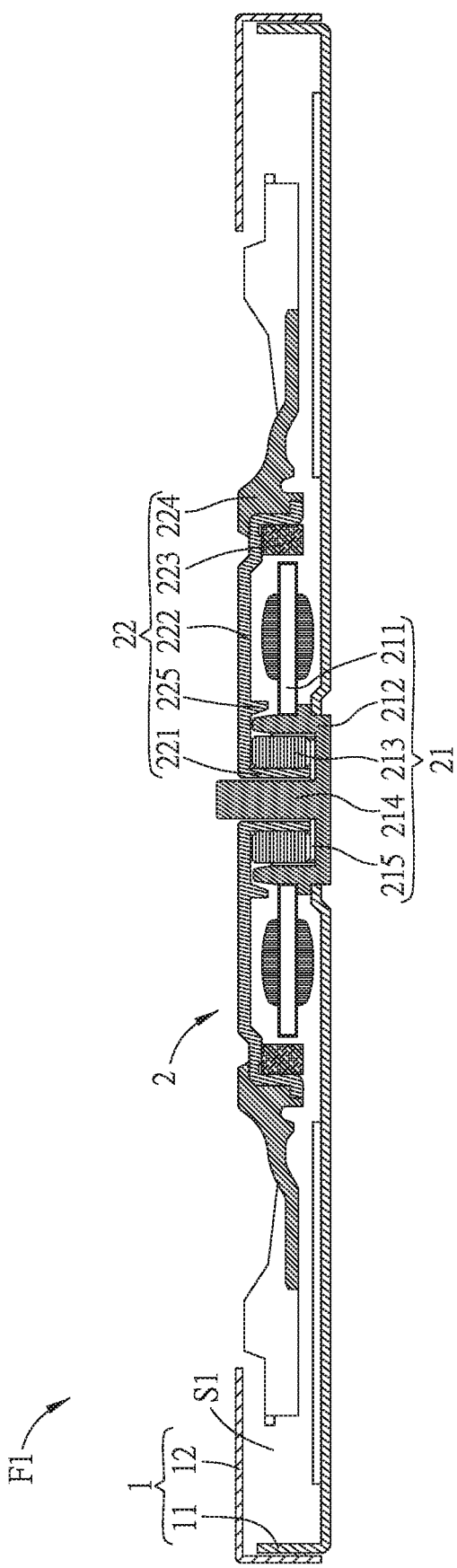
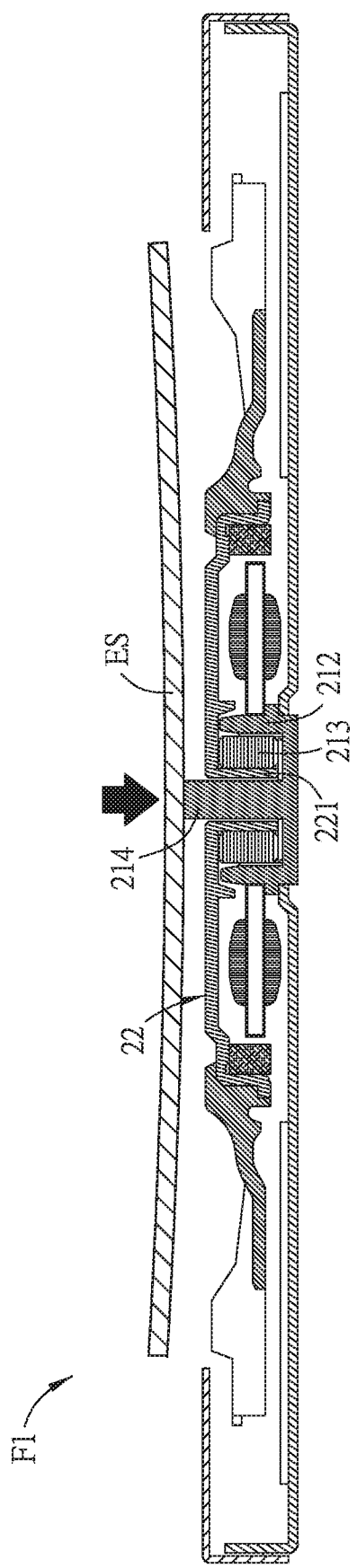

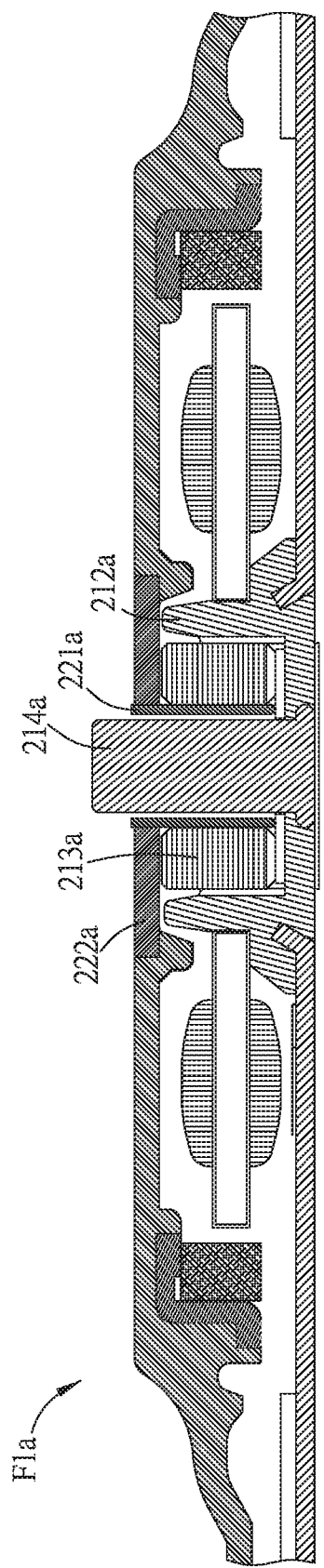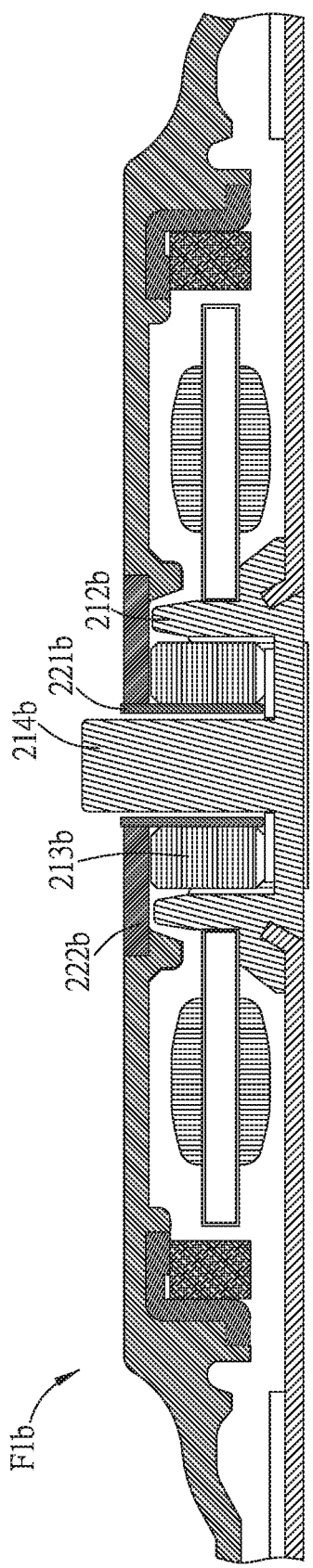

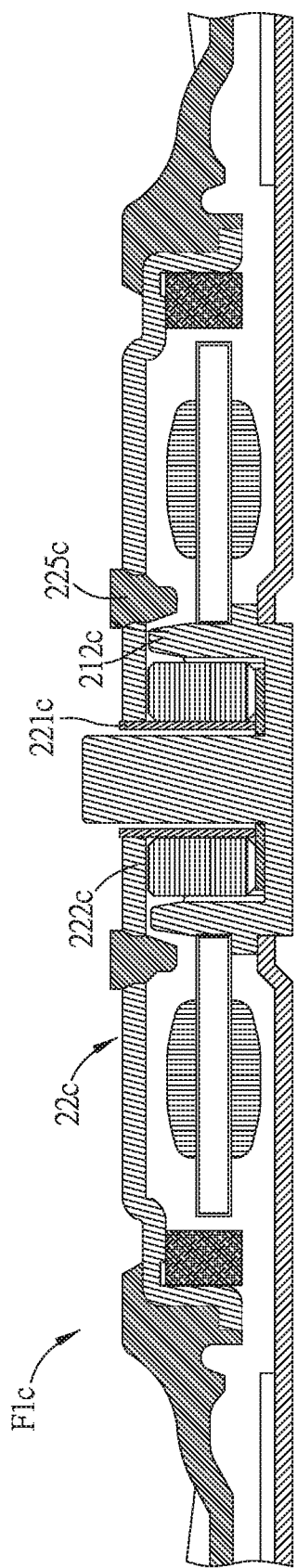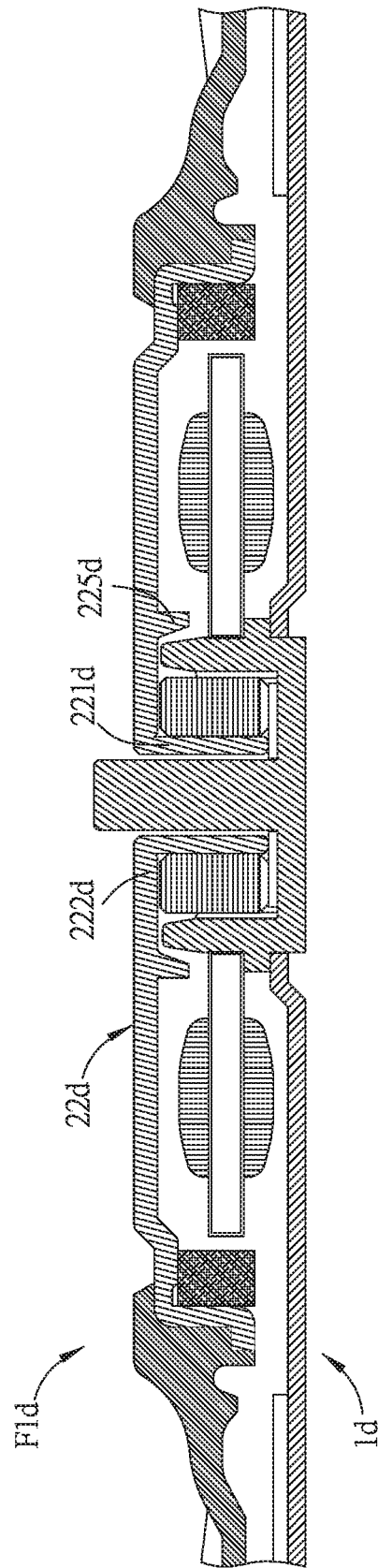
FIG. 2C
FIG. 2D

THIN FAN

CROSS REFERENCE TO RELATED APPLICATIONS

The non-provisional patent application claims priority to U.S. provisional patent application with Ser. No. 62/458,688 filed on Feb. 14, 2017. This and all other extrinsic materials discussed herein are incorporated by reference in their entirety.

This Non-provisional application claims priority under 35 U.S.C. § 119(a) on Patent Application No(s). 201710494625.1 filed in People's Republic of China on Jun. 26, 2017, the entire contents of which are hereby incorporated by reference.

BACKGROUND OF THE INVENTION

Field of Invention

The present disclosure relates to a thin fan having a compression-resistant pillar.

Related Art

In the existing electronic device, the fan is generally used as the major heat dissipation device. However, as the electronic devices are designed thinner, the heat dissipation fan also becomes thinner. The conventional thin fan includes a rotor structure composed of a shaft, a rotor shell, an impeller and a magnetic ring. When the power is turned on, the entire rotor structure is rotated to generate the airflow for achieving the desired heat dissipation efficiency.

Since the internal space of the thin electronic device is relatively smaller, the gaps between the components inside the electronic device are very tinny. Thus, the size and accommodating space of the thin fan are sufficiently limited. Moreover, the thickness of the frame shell is relatively thinner, so that the entire structural strength of the thin fan is weaker. Unfortunately, when the structural strength of the thin fan becomes weaker, the external structure or the frame shell will be easily deformed during the operation, which may press the rotor structure and cause the serious interference to the operating rotor structure. Furthermore, the wearing status of the bearing can be much worse than expectation, and the rotor structure can be forced to stop. These situations will cause the damage of the structure and decrease the lifetime of the thin fan.

The above-mentioned issues have been disclosed in U.S. Patent Application No. US20150098844A1 and U.S. Pat. No. 8,724,256B2. Herein, the center of the bushing of the electronic device or fan is configured with a static fixing axis. The height of the fixing axis is equal to or greater than that of the rotor structure. The fixing axis is firmly connected to the external structure for resisting the deformation of the external structure. This configuration is to prevent the external structure to compress the rotor structure, which may cause the undesired affects to the operation and structure of the fan. However, the fixing axis is firmly connected to the external structure, so that the assembling gap between the external structure and the electronic device or fan becomes very small. This will decrease the assembling flexibility of the electronic device and the fan and affect the flowing space of the flowing field and the heat dissipation effect.

In addition, as disclosed in Taiwan Patent No. TWM442, 689U1, the center ring base of the stator structure is configured with a reversed shaft, and the oil bearing of the rotor-impeller assembly is disposed between the shaft and the bushing. In the heat dissipation fan, the reversed shaft is configured to against the deformation of the external structure so as to remain the operation of the rotor-impeller assembly and prevent the interference of the deformed external structure. When the heat dissipation fan operates, the additional restriction and connection structures are needed for fixing the oil bearing on the inner wall of the bushing. The configuration makes the structure of the rotor-impeller assembly more complex, and the size of the rotor-impeller assembly cannot be effectively minimized. Thus, the manufacturing and assembling processes of the heat dissipation fan are complicated.

Therefore, it is an important subject to prevent the compression and stop of the rotor structure caused by the external structure and protect the internal components of the structure from damage.

SUMMARY OF THE INVENTION

In view of the foregoing, the present disclosure provides a thin fan, which includes a frame and a driving device. The frame includes a base and a frame shell. The frame shell and the base are connected to define an accommodating space. The driving device is disposed in the accommodating space and includes a stator structure and a rotor structure. The stator structure includes a stator pole group, a bushing, a bearing and a compression-resistant pillar. The bushing is disposed on the base, and the stator pole group is disposed on an outer periphery of the bushing. The compression-resistant pillar and the bearing are disposed inside the bushing, and the compression-resistant pillar is connected to the bushing. The rotor structure is disposed corresponding to the stator structure. The compression-resistant pillar is an axis of the rotor structure and is not rotated along with the rotor structure. The rotor structure includes a hollow-cylindrical shaft, a rotor shell, a magnetic structure and an impeller. The hollow-cylindrical shaft is mounted on an outer periphery of the compression-resistant pillar and is disposed between the compression-resistant pillar and the bearing. A surface of the shaft facing the bearing and the compression-resistant pillar is not directly contacted with the stator structure. The rotor shell is connected to the shaft, and the magnetic structure is disposed on an inner wall of the rotor shell. The stator pole group magnetically drives the magnetic structure as well as the rotor shell and the shaft to rotate. The impeller is connected to the rotor shell. A vertical distance between a top surface of the rotor shell and the base is less than a vertical distance between a top end of the compression-resistant pillar and the base when the rotor structure is connected to the stator structure.

In one embodiment, a maximum height of the frame is smaller than 5 mm.

In one embodiment, the compression-resistant pillar and the bushing are integrated formed as a single component.

In one embodiment, a material of the compression-resistant pillar comprises steel, copper, zinc, plastics, or ceramics.

In one embodiment, the rotor shell and the shaft are a single component manufactured by directly processing a single material workpiece.

In one embodiment, the rotor structure further includes an oil seal structure disposed on the rotor shell and surrounding a periphery of the shaft, and the oil seal structure is located corresponding to the bushing.

In one embodiment, the oil seal structure, the rotor shell and the shaft are a single component manufactured by directly processing a single material workpiece.

In one embodiment, a surface of the shaft, the oil seal structure or the rotor shell facing the stator structure and corresponding to the bushing is formed with an oil repellent layer.

In one embodiment, the stator structure further includes a wear structure disposed at a bottom of the bearing. The wear structure and the bearing are disposed inside the bushing. The wear structure is surrounding a periphery of a bottom of the compression-resistant pillar. An end portion of the shaft has a guiding angle structure, and the end portion is contacted with the wear structure.

In one embodiment, a surface of the bearing facing the shaft is configured with a plurality of groove structures, and the groove structures are U-shaped grooves, V-shaped grooves, oblique grooves, or annular grooves.

In one embodiment, the bearing is an oil bearing, a hydrodynamic bearing or a ceramic bearing.

The present disclosure also provides a thin fan, which includes a frame and a driving device. The frame includes a base and a frame shell. The frame shell and the base are connected to define an accommodating space. The driving device is disposed in the accommodating space and includes a stator structure and a rotor structure. The stator structure includes a stator pole group, a bushing, a rolling bearing and a compression-resistant pillar. The bushing is disposed on the base, the stator pole group is disposed on an outer periphery of the bushing, and the compression-resistant pillar and the rolling bearing are disposed inside the bushing. The compression-resistant pillar is connected to the bushing. The rolling bearing includes an inner ring, an outer ring, at least a retaining unit, and a plurality of rolling units. The rolling units are contacted with the retaining unit, the inner ring and the outer ring simultaneously. An inner edge of the inner ring is connected to the compression-resistant pillar. The rotor structure is disposed corresponding to the stator structure. The compression-resistant pillar is an axis of the rotor structure and is not rotated along with the rotor structure. The rotor structure includes a hollow-cylindrical shaft, a rotor shell, a magnetic structure and an impeller. The hollow-cylindrical shaft is mounted on an outer periphery of the outer ring and disposed between the rolling bearing and the bushing. The rotor shell is connected to the shaft. The magnetic structure is disposed on an inner wall of the rotor shell. The stator pole group magnetically drives the magnetic structure as well as the rotor shell and the shaft to rotate. The impeller is connected to the rotor shell. A vertical distance between a top surface of the rotor shell and the base is less than a vertical distance between a top end of the compression-resistant pillar and the base when the rotor structure is connected to the stator structure.

In one embodiment, a maximum height of the frame is smaller than 5 mm.

In one embodiment, the compression-resistant pillar and the bushing are integrated formed as a single component.

In one embodiment, a material of the compression-resistant pillar includes steel, copper, zinc, plastics, or ceramics.

In one embodiment, the rotor shell and the shaft are a single component manufactured by directly processing a single material workpiece.

As mentioned above, the thin fan of the disclosure utilizes a compression-resistant pillar as the axis of the rotor structure. When the rotor structure is connected to the stator structure, the height of the compression-resistant pillar is greater than the maximum height of the rotor structure. Accordingly, once the thin fan is pressed by the external structure, the compression-resistant pillar can resist against the deformed external structure and protect the shaft so as to keep the normal operation of the rotor structure.

In the manufacturing process, the compression-resistant pillar is directly disposed on the bushing and located at the axis of the rotor structure. This design does not interfere the flowing field, and can reduce the assembling steps of the thin fan, decrease the manufacturing cost, and remain the property and lifetime of the thin fan.

BRIEF DESCRIPTION OF THE DRAWINGS

The present invention will become more fully understood from the subsequent detailed description and accompanying drawings, which are given by way of illustration only, and thus are not limitative of the present invention, and wherein:

FIG. 1B is a sectional view of the thin fan of FIG. 1A along the line A-A;

FIG. 1C is a schematic diagram showing the thin fan of FIG. 1B under a pressure status;

FIGS. 2A to 2D are schematic diagram showing different aspects of the compression-resistant pillars, bushings, and rotor structures;

DETAILED DESCRIPTION OF THE INVENTION

The present invention will be apparent from the following detailed description, which proceeds with reference to the accompanying drawings, wherein the same references relate to the same elements.

Figure 1A:
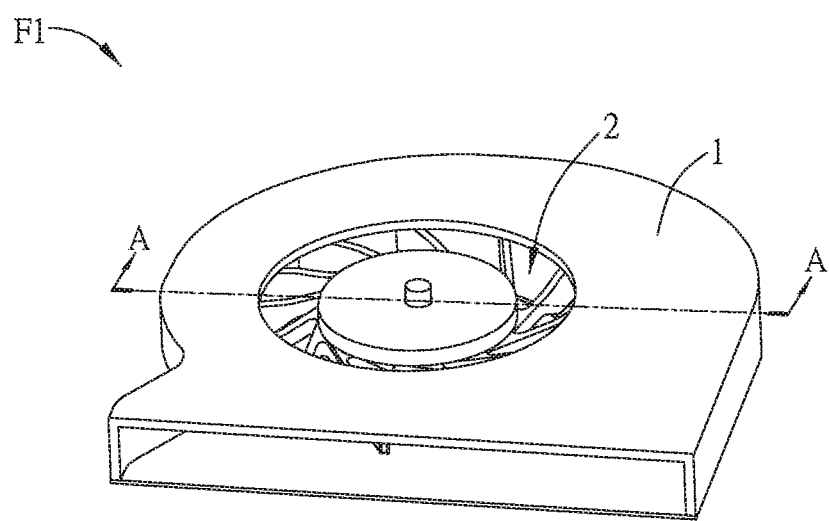
FIG. 1A is a schematic diagram showing a thin fan according to an embodiment of the disclosure.

FIG. 1A is a schematic diagram showing a thin fan according to an embodiment of the disclosure, FIG. 1B is a sectional view of the thin fan of FIG. 1A along the line A-A, and FIG. 1C is a schematic diagram showing the thin fan of FIG. 1B under a pressure status.

Referring to FIGS. 1A to 1C, the present disclosure provides a thin fan F1 including a frame 1 and a driving device 2. The frame 1 includes a base 11 and a frame shell 12. The frame shell 12 and the base 11 are connected to define an accommodating space 51. The driving device 2 is disposed in the accommodating space 51 and includes a stator structure 21 and a rotor structure 22. The stator structure 21 includes a stator pole group 211, a bushing 212, a bearing 213, and a compression-resistant pillar 214. The bushing 212 is disposed on the base 11, and the stator pole group 211 is disposed on an outer periphery of the bushing 212. The compression-resistant pillar 214 and the bearing 213 are disposed inside the bushing 212, and the compression-resistant pillar 214 is connected to the bushing 212. The bearing 213 can be an oil bearing, a hydrodynamic bearing or a ceramic bearing. The rotor structure 22 is disposed corresponding to the stator structure 21. The compression-resistant pillar 214 is an axis of the rotor structure 22 and is not rotated along with the rotor structure 22. The rotor structure 22 includes a hollow-cylindrical shaft 221, a rotor shell 222, a magnetic structure 223, and an impeller 224. The hollow-cylindrical shaft 221 is mounted on an outer periphery of the compression-resistant pillar 214 and disposed between the compression-resistant pillar 214 and the bearing 213. A surface of the shaft 221 facing the bearing 213 and the compression-resistant pillar 214 is not directly contacted with the stator structure 21. In more detailed, a gap is formed between the shaft 221 and the compression-resistant pillar 214, and the shaft 221 is not contacted with the bearing 213. The rotor shell 222 is connected to the shaft 221, and the magnetic structure 223 is disposed on an inner wall of the rotor shell 222. The stator pole group 211 magnetically drives the magnetic structure 223 as well as the rotor shell 222 and the shaft 221 to rotate. The impeller 224 is connected to the rotor shell 222. A vertical distance between a top surface of the rotor shell 222 and the base 11 is less than a vertical distance between a top end of the compression-resistant pillar 214 and the base 11 when the rotor structure 22 is connected to the stator structure 21.

In the thin fan F1 of this disclosure, the height of the compression-resistant pillar 214 is greater than the maximum height of the rotor structure 22, and the compression-resistant pillar 214 is not contacted with the inner wall of the hollow shaft 221. This design can resist the colloid friction between the rotor structure 22 and the external structure ES. As shown in FIG. 1C, when the thin fan F1 is pressed by the external structure ES, the compression-resistant pillar 214 can contact against the deformed external structure ES and keep the shaft 221 standing straight. In addition, a gap is formed between the shaft 221 and the compression-resistant pillar 214, and the shaft 221 is not contacted with the bearing 213, so that the rotor structure 22 can still normally operate, and the deformations of the external structure ES and the thin fan F1 can be sufficiently reduced. Moreover, the compression-resistant pillar 214 is directly disposed on the bushing 212 and located at the axis of the rotor structure 22. This design does not interfere the flowing field, and can reduce the assembling steps of the thin fan F1, decrease the manufacturing cost, and remain the property and lifetime of the thin fan F1.

In this embodiment, the stator structure 21 further includes a wear structure 215 disposed at a bottom of the bearing 213. The wear structure 215 and the bearing 213 are disposed inside the bushing 212. The wear structure 215 is surrounding a periphery of the bottom of the compression-resistant pillar 214. An end portion of the shaft 221 has a guiding angle structure (not shown), and the end portion is contacted with the wear structure 215. Herein, the wear structure 215 has a through hole, and the compression-resistant pillar 214 passes through the through hole. The guiding angle structure of the end portion of the shaft 221 can be an arc or hemispherical structure for decreasing the friction of the rotating shaft 221, maintaining the operation of the rotor structure, and decreasing the wear and tear of the shaft 221 and the bearing 213.

In addition, the rotor structure 22 of the thin fan F1 further includes an oil seal structure 225 disposed on the rotor shell 222 and surrounding a periphery of the shaft 221. The oil seal structure 225 is located corresponding to the bushing 212. A surface of the shaft 221, the oil seal structure 225, or the rotor shell 222 facing the stator structure 21 and corresponding to the bushing 212 is formed with an oil repellent layer (not shown). The configuration of the oil seal structure 225 can further enhance the ability of preventing oil leakage of the thin fan F1. Furthermore, a surface of the bearing 213 facing the shaft 221 can be configured with a plurality of groove structures (not shown). The groove structures can be U-shaped grooves, V-shaped grooves, oblique grooves, or annular grooves. The configuration of the groove structures an increase the axial supporting ability of the shaft 221, reduce the adverse pressure generated in operation, enhance the operation stability of the rotor structure 22, and increase the lifetime of the thin fan F1.

FIGS. 2A to 2D are schematic diagram showing different aspects of the compression-resistant pillars, bushings, and rotor structures.

In this embodiment, the material of the compression-resistant pillar includes steel, copper, zinc, plastics, or ceramics. For example, the steel material can be carbon steel, spring steel, alloy steel, stainless steel or maraging steel. In different manufacturing processes or product designs, the compression-resistant pillar and the bushing can be made of the same material, or they can be different components. In more detailed, as shown in FIG. 2A, the compression-resistant pillar 214a of the thin fan F1a is disposed inside the bushing 212a, and the compression-resistant pillar 214a is connected to the bushing 212a. The compression-resistant pillar 214a and the bushing 212a are made of the same material. In this aspect, the bushing 212a can be plastic material, which encapsulates the metal compression-resistant pillar 214a by injection molding. Alternatively, as shown in FIG. 2B, the compression-resistant pillar 214b and the bushing 212b are integrated formed as a single piece. In this aspect, the compression-resistant pillar 214b and the bushing 212b are made of copper, which is processed by a turning process. Alternatively, the compression-resistant pillar 214b and the bushing 212b can be integrally formed as one piece by injection molding (using metal powder).

In addition, in different manufacturing processes or product designs, the shaft and the rotor shell can be made of the same material, or they can be different components. As shown in FIG. 2C, the oil seal structure 225c of the thin fan F1c is disposed on the rotor shell 222c and surrounding the periphery of the shaft 221c, and the oil seal structure 225c is located corresponding to the bushing 212c. In this aspect, the shaft 221c and the rotor shell 222c are different components made of different materials. Furthermore, the rotor shell can be made of two or more materials. As shown in FIG. 2A, a portion of the rotor shell 222a closing to the shaft 221a, the bearing 213a and the bushing 212a can be made of a material with higher rigidity (e.g. a galvanized steel plate) for enhancing the wear ability of the rotor shell 222a. Similarly, as shown in FIG. 2B, a portion of the rotor shell 222b closing to the shaft 221b, the bearing 213b and the bushing 212b can be made of a material with higher rigidity (e.g. a galvanized steel plate) for enhancing the wear ability of the rotor shell 222b.

As shown in FIG. 2D, in the thin fan F1d, the rotor shell 222d and the shaft 221d are a single component manufactured by directly processing a single material workpiece, and the oil seal structure 225d, the rotor shell 222d and the shaft 221d are also a single component manufactured by directly processing a single material workpiece. The above components can be made of the same material such as a pure metal material or an alloy material. In addition, the rotor shell 222d, the shaft 221d and the oil seal structure 225d are manufactured by one turning process or one molding process instead of assembling, welding, adhering, or locking. The rotor shell 222d, the shaft 221d and the oil seal structure 225d of this embodiment are a seamless and integrated single component. Accordingly, this configuration can satisfy the required rigidity condition of the rotor structure 22d, and the metal rotor shell 222d can achieve a thinner design for sufficiently reducing the height of the frame 1d. In this embodiment, the maximum height of the frame 1d is smaller than 5 mm. In some embodiments, the maximum height of the frame 1d is 2.5 mm. Accordingly, the thin fan F1d can be further thinned.

In the thin fan of the disclosure, the rotor shell, the shaft and the oil seal structure can be manufactured by CNC (Computer Numerical Control) machining or molding to form a seamless and integrated single component. Herein, the rotor structure can be processed by a single machining to achieve the desired accuracy and flatness, so the material for manufacturing additional shaft can be reduced so as to decrease the manufacturing cost, improve the entire process stability and manufacturing yield, and simplify the assembling process of the thin fan.

Figure 3A:
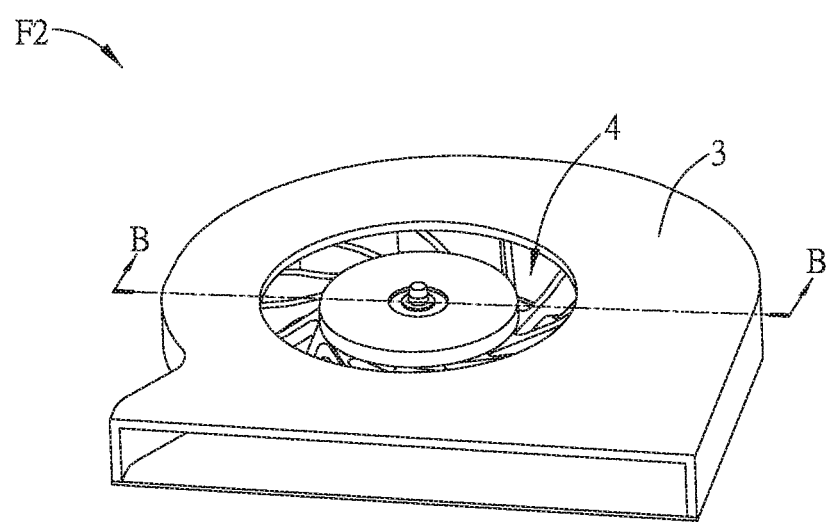
FIG. 3A is a schematic diagram showing a thin fan according to another embodiment of the disclosure.
Figure 3B:
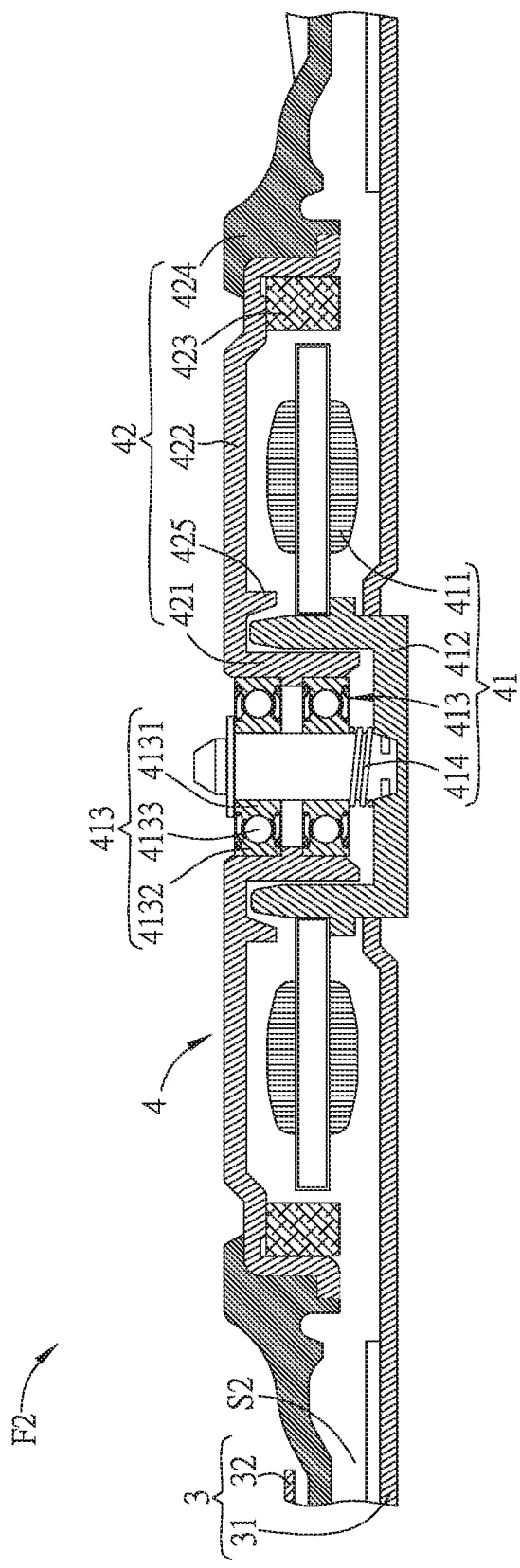
FIG. 3B is a sectional view of the thin fan of FIG. 3A along the line B-B.

FIG. 3A is a schematic diagram showing a thin fan according to another embodiment of the disclosure, and FIG. 3B is a sectional view of the thin fan of FIG. 3A along the line B-B.

As shown in FIGS. 3A and 3B, the present disclosure also provides a thin fan F2, which includes a frame 3 and a driving device 4. The frame 3 includes a base 31 and a frame shell 32. The frame shell 32 and the base 31 are connected to define an accommodating space S2. The driving device 4 is disposed in the accommodating space S2 and includes a stator structure 41 and a rotor structure 42. The stator structure 41 includes a stator pole group 411, a bushing 412, a rolling bearing 413, and a compression-resistant pillar 414. The bushing 412 is disposed on the base 31, the stator pole group 411 is disposed on an outer periphery of the bushing 412, and the compression-resistant pillar 414 and the rolling bearing 413 are disposed inside the bushing 412. The compression-resistant pillar 414 is connected to the bushing 412. The rolling bearing 413 includes an inner ring 4131, an outer ring 4132, at least a retaining unit (not shown), and a plurality of rolling units 4133. The rolling units 4133 are disposed inside the retaining unit and contacted with the retaining unit, the inner ring 4131, and the outer ring 4132 simultaneously. An inner edge of the inner ring 4131 is connected to the compression-resistant pillar 414. In this embodiment, the rolling bearing 414 can be a ball bearing or a roller bearing. The rotor structure 42 is disposed corresponding to the stator structure 41. The compression-resistant pillar 414 is an axis of the rotor structure 42 and is not rotated along with the rotor structure 42. The rotor structure 42 includes a hollow-cylindrical shaft 421, a rotor shell 422, a magnetic structure 423, and an impeller 424. The hollow-cylindrical shaft 421 is mounted on an outer periphery of the outer ring 4132 and disposed between the rolling bearing 413 and the bushing 412. The rotor shell 422 is connected to the shaft 421. The magnetic structure 423 is disposed on an inner wall of the rotor shell 422. The stator pole group 411 magnetically drives the magnetic structure 423 as well as the rotor shell 422 and the shaft 421 to rotate. The impeller 424 is connected to the rotor shell 422. A vertical distance between a top surface of the rotor shell 422 and the base 31 is less than a vertical distance between a top end of the compression-resistant pillar 414 and the base 31 when the rotor structure 42 is connected to the stator structure 41.

In addition, the rotor structure 42 of the thin fan F2 further includes an oil seal structure 425 disposed on the rotor shell 422 and surrounding a periphery of the bushing 412. The oil seal structure 425 is located corresponding to the bushing 412. The oil seal structure 425, the rotor shell 422 and the shaft 421 can be different components made of different materials, or they can be a single component manufactured by directly processing a single material workpiece. A surface of the shaft 421, the oil seal structure 425, or the rotor shell 422 facing the stator structure 41 and corresponding to the bushing 412 is formed with an oil repellent layer (not shown). The configuration of the oil seal structure 425 and the oil repellent layer can further enhance the ability of preventing oil leakage of the thin fan F2 and increase the lifetime of the thin fan F2.

The technical features of the bushing 412, the compression-resistant pillar 414, the shaft 421 and the rotor shell 422 of the thin fan F2 can be referred to those of the thin fan F1 shown in FIGS. 2A to 2D, so the detailed features thereof are omitted and the descriptions thereof will be illustrated hereinafter.

In this embodiment, the material of the compression-resistant pillar 414 includes steel, copper, zinc, plastics, or ceramics. For example, the steel material can be carbon steel, spring steel, alloy steel, stainless steel or maraging steel. In different manufacturing processes or product designs, the compression-resistant pillar 414 and the bushing 412 can be made of the same material, or they can be different components. Similar to the features and theory of the thin fans F1 shown in FIGS. 2A to 2D, the compression-resistant pillar 414 of the thin fan F2 is disposed inside the bushing 412, and the compression-resistant pillar 414 is connected to the bushing 412. The compression-resistant pillar 414 and the bushing 412 are made of the same material. In this aspect, the bushing 412 can be plastic material, which encapsulates the metal compression-resistant pillar 414 by injection molding. Alternatively, the compression-resistant pillar 414 and the bushing 412 are integrated formed as a single piece. In this aspect, the compression-resistant pillar 414 and the bushing 412 are made of copper, which is processed by a turning process. Alternatively, the compression-resistant pillar 414 and the bushing 412 can be integrally formed as one piece by injection molding (using metal powder).

In addition, in different manufacturing processes or product designs, the shaft 421 and the rotor shell 422 can be made of the same material, or they can be different components. In this embodiment, the rotor shell 422 can be made of two or more materials, so that a portion of the rotor shell 422 closing to the shaft 421, the bearing 413 and the bushing 412 can be made of a material with higher rigidity (e.g. a galvanized steel plate) for enhancing the wear ability of the rotor shell 422. This disclosure is not limited thereto.

Similar to the features and theory of the thin fan F1 shown in FIGS. 2A to 2D, the rotor shell 422 and the shaft 421 of the thin fan F2 are a single component manufactured by directly processing a single material workpiece, and the oil seal structure 425, the rotor shell 422 and the shaft 421 are also a single component manufactured by directly processing a single material workpiece. The above components can be made of the same material such as a pure metal material or an alloy material. In addition, the rotor shell 422, the shaft 421 and the oil seal structure 425 are manufactured by one turning process or one molding process instead of assembling, welding, adhering, or locking. The rotor shell 422, the shaft 421 and the oil seal structure 425 of this embodiment are a seamless and integrated single component. Accordingly, this configuration can satisfy the required rigidity condition of the rotor structure 42, and the metal rotor shell 422 can achieve a thinner design for sufficiently reducing the height of the frame 3. In this embodiment, the maximum height of the frame 3 is smaller than 5 mm. In some embodiments, the maximum height of the frame 3 is 2.5 mm. Accordingly, the thin fan F2 can be further thinned.

In summary, the thin fan of the disclosure utilizes a compression-resistant pillar as the axis of the rotor structure. When the rotor structure is connected to the stator structure, the height of the compression-resistant pillar is greater than the maximum height of the rotor structure. Accordingly, once the thin fan is pressed by the external structure, the compression-resistant pillar can resist against the deformed external structure and protect the shaft so as to keep the normal operation of the rotor structure. In the manufacturing process, the compression-resistant pillar is directly disposed on the bushing and located at the axis of the rotor structure. This design does not interfere the flowing field, and can reduce the assembling steps of the thin fan, decrease the manufacturing cost, and remain the property and lifetime of the thin fan.

Moreover, in different manufacturing processes or product designs, the compression-resistant pillar and the bushing can be made of the same material, or they can be different components. In addition, the shaft, the rotor shell and/or the oil seal structure can be made of the same material, or they can be different components. This disclosure includes a single manufacturing process to machine a single material workpiece, so that the assembling steps of the thin fan can be reduced, the manufacturing and detection costs can be decreased, the required accuracy of the components can be achieved, and the entire process stability can be enhanced.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A thin fan, comprising:
    a frame comprising a base and a frame shell, wherein the frame shell and the base are connected to define an accommodating space; and
    a driving device disposed in the accommodating space and comprising:
        a stator structure comprising a stator pole group, a bushing, a bearing and a compression-resistant pillar, wherein the bushing is disposed on the base, the stator pole group is disposed on an outer periphery of the bushing, the compression-resistant pillar and the bearing are disposed inside the bushing, and the compression-resistant pillar is connected to the bushing, the compression-resistant pillar and the bushing are integrated and formed as a single component; and
        a rotor structure disposed corresponding to the stator structure, wherein the compression-resistant pillar is an axis of the rotor structure and is not rotated along with the rotor structure, and the rotor structure comprises:
            a hollow-cylindrical shaft mounted on an outer periphery of the compression-resistant pillar and disposed between the compression-resistant pillar and the bearing, wherein a gap is formed between the inner surface of the hollow-cylindrical shaft and the compression-resistant pillar so that the compression-resistant pillar is not contacted with the inner wall of the hollow-cylindrical shaft, and wherein an outer surface of the hollow-cylindrical shaft facing the bearing is not contacted with the bearing,
            a rotor shell connected to the shaft,
            a magnetic structure disposed on an inner wall of the rotor shell, wherein the stator pole group magnetically drives the magnetic structure as well as the rotor shell and the shaft to rotate,
            an impeller connected to the rotor shell;
    a wear structure element disposed inside the bushing and beneath the bearing, the wear structure element surrounding a periphery of a bottom of the compression-resistant pillar, wherein an end portion of the shaft has a guiding angle structure, the end portion of the shaft is contacted with the wear structure element,
    wherein, a vertical distance between a top surface of the rotor shell and the base is less than a vertical distance between a top end of the compression-resistant pillar and the base when the rotor structure is connected to the stator structure, the height of the compression-resistant pillar is greater than the maximum height of the rotor structure.

2. The thin fan according to claim 1, wherein a maximum height of the frame is smaller than 5 mm.

3. The thin fan according to claim 1, wherein a material of the compression-resistant pillar comprises steel, copper, zinc, plastics, or ceramics.

4. The thin fan according to claim 1, wherein the rotor shell and the shaft are a single component manufactured by directly processing a single material workpiece.

5. The thin fan according to claim 1, wherein the rotor structure further comprises:
    an oil seal structure disposed on the rotor shell and surrounding a periphery of the shaft, wherein the oil seal structure is located corresponding to the bushing.

6. The thin fan according to claim 5, wherein the oil seal structure, the rotor shell and the shaft are a single component manufactured by directly processing a single material workpiece.

7. The thin fan according to claim 5, wherein a surface of the shaft, the oil seal structure or the rotor shell facing the stator structure and corresponding to the bushing is formed with an oil repellent layer.

8. The thin fan according to claim 1, wherein a surface of the bearing facing the shaft is configured with a plurality of groove structures, and the groove structures are U-shaped grooves, V-shaped grooves, oblique grooves, or annular grooves.

9. The thin fan according to claim 1, wherein the bearing is an oil bearing, or a hydrodynamic bearing.

* * * * *